(12) United States Patent
Li

(10) Patent No.: US 7,737,497 B2
(45) Date of Patent: Jun. 15, 2010

(54) SILVER NANOPARTICLE COMPOSITIONS

(75) Inventor: Yuning Li, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 109 days.

(21) Appl. No.: 11/946,923

(22) Filed: Nov. 29, 2007

(65) Prior Publication Data
US 2009/0140336 A1 Jun. 4, 2009

(51) Int. Cl.
*H01L 29/786* (2006.01)
*H01L 21/44* (2006.01)
(52) U.S. Cl. .............................. 257/347; 257/E29.273; 257/E21.411; 438/686; 438/149
(58) Field of Classification Search ................. 257/347, 257/40, 57, 59, 66, 72, E29.147, E29.139, 257/E29.273, E21.411; 438/149, 686, 661; 75/371
See application file for complete search history.

(56) References Cited

U.S. PATENT DOCUMENTS

| | | | | |
|---|---|---|---|---|
| 6,103,868 | A * | 8/2000 | Heath et al. ................. | 528/482 |
| 6,262,129 | B1 * | 7/2001 | Murray et al. ............... | 516/33 |
| 6,348,295 | B1 | 2/2002 | Griffith et al. | |
| 6,572,673 | B2 * | 6/2003 | Lee et al. .................... | 75/362 |
| 7,270,694 | B2 | 9/2007 | Li et al. | |
| 2004/0043691 | A1 * | 3/2004 | Abe et al. ................... | 445/24 |
| 2005/0129843 | A1 | 6/2005 | Wu et al. | |
| 2006/0073667 | A1 * | 4/2006 | Li et al. ..................... | 438/311 |
| 2006/0254387 | A1 * | 11/2006 | Lee et al. .................... | 75/252 |
| 2007/0099357 | A1 | 5/2007 | Li et al. | |

OTHER PUBLICATIONS

Dimitrakopoulos, Christos D. and Malenfant, Patrick R.L., "*Organic Thin Film Transistors for Large Area Electronics*", Adv. Mater. 2002, 14, No. 2, Jan. 16.
Hiramatsu, Hiroki and Osterloh, Frank E. "*A Simple Large-Scale Synthesis of Nearly Monodisperse Gold and Silver Nanoparticles with Adjustable Sizes and with Exchangeable Surfactants*", Chemistry of Materials, vol. 16, o. 13. Jun. 29, 2004.
Wu, Yiliang, Li, Yuning, and Ong, Beng S., "*Printed Silver Ohmic Contacts for High-Mobility Organic Thin-Film Transistors*", J. Am. Chem. Soc. 2006, 128, 4202-4203.
Lin, Xue Zhang, Teng, Xaowei, and Yang, Hong, "*Direct Synthesis of Narrowly Dispersed Silver Nanoparticles Using a Single-Source Precursor*", Langmuir, 2003, 19, 10081-10085.

* cited by examiner

Primary Examiner—Victor A Mandala
Assistant Examiner—Scott Stowe
(74) Attorney, Agent, or Firm—Fay Sharpe LLP

(57) ABSTRACT

A silver nanoparticle composition is formed by the process comprising: providing a solution of silver-containing nanoparticles and an initial stabilizer on the surface of the silver-containing nanoparticles; and mixing the solution with a carboxylic acid so as to replace at least a portion of the initial stabilizer with the carboxylic acid, resulting in a composition comprising the silver-containing nanoparticles and the carboxylic acid on the surface of the silver-containing nanoparticles. Methods of using the silver nanoparticle composition and devices comprising the silver nanoparticle composition are also disclosed.

20 Claims, 2 Drawing Sheets

SILVER NANOPARTICLE COMPOSITIONS

CROSS REFERENCE TO RELATED PATENTS AND APPLICATIONS

Reference is made to the six following related and commonly assigned patent applications, all of which are hereby fully incorporated by reference herein:

Yiliang Wu et al., U.S. application Ser. No. 10/733,136, filed Dec. 11, 2003, titled "NANOPARTICLE DEPOSITION PROCESS."

Yuning Li et al., U.S. Pat. No. 7,270,694, titled "STABILIZED SILVER NANOPARTICLES AND THEIR USE."

Yiliang Wu et al., U.S. application Ser. No. 11/187,552, filed Jul. 22, 2005, titled "METHODS TO MINIMIZE CONTACT RESISTANCE," in condition for allowance except for formal matters as of Aug. 8, 2007.

Yiliang Wu et al., U.S. application Ser. No. 11/543,661, filed Oct. 5, 2006, titled "SILVER-CONTAINING NANOPARTICLES WITH REPLACEMENT STABILIZER."

Yuning Li et al., U.S. application Ser. No. 11/611,228, filed Dec. 15, 2006, titled "DEVICES CONTAINING ANNEALED STABILIZED SILVER NANOPARTICLES."

Yuning Li et al., U.S. application Ser. No. 11/837,023, filed Aug. 10, 2007, titled "STABILIZED SILVER NANOPARTICLES AND THEIR USE."

BACKGROUND

Disclosed herein, in various embodiments, are stable, high performing nanoparticle compositions as well as processes and devices for making and/or using the same.

Fabrication of electronic circuit elements using liquid deposition techniques may be beneficial as such techniques provide potentially low-cost alternatives to conventional mainstream amorphous silicon technologies for electronic applications such as thin film transistors (TFTs), light-emitting diodes (LEDs), RFID tags, photovoltaics, etc. However, the deposition and/or patterning of functional electrodes, pixel pads, and conductive traces, lines and tracks which meet the conductivity, processing, and cost requirements for practical applications have been a great challenge. The metal, silver, is of particular interest as conductive elements for electronic devices because silver is much lower in cost than gold and it possesses much better environmental stability than copper. There is therefore a critical need, addressed by embodiments of the present disclosure, for lower cost methods for preparing liquid processable, stable silver-containing nanoparticle compositions that are suitable for fabricating electrically conductive elements of electronic devices.

BRIEF DESCRIPTION

The present application discloses, in various exemplary embodiments, processes for preparing silver-containing nanoparticle compositions, as well as the compositions so produced. Devices which use the nanoparticle compositions, such as thin film transistors, are also disclosed.

In exemplary embodiments, a silver nanoparticle composition is formed by a process which comprises:

providing a first solution comprising silver-containing nanoparticles with an initial stabilizer on the surface of the silver-containing nanoparticles; and mixing the first solution with a carboxylic acid so as to replace at least a portion of the initial stabilizer with the carboxylic acid, resulting in a composition comprising the silver-containing nanoparticles and the carboxylic acid on the surface of the silver-containing nanoparticles.

The molar ratio of carboxylic acid in the second solution to silver in the first solution may be from 0.01 to about 1, or from about 0.05 to about 1, or from about 0.05 to about 0.5.

The initial stabilizer may comprise an organoamine. The organoamine may have from about 6 to about 18 carbon atoms.

The silver-containing nanoparticles may have an average diameter of from about 1 nanometer to about 1000 nanometers.

The carboxylic acid may have at least 4 carbon atoms.

In other embodiments, a process for making an electronic device is disclosed which comprises:

depositing a composition upon a substrate, the composition comprising silver-containing nanoparticles with a carboxylic acid on the surface of the silver-containing nanoparticles, resulting in a deposited composition; and heating the deposited composition to form an electrically conductive layer comprising silver.

The heating may be performed at a temperature of from about 100° C. to about 300° C., from about 150° C. to about 200° C., or from about 170° C. to about 190° C.

The composition may further comprise an initial stabilizer on the surface of the silver-containing nanoparticles. The initial stabilizer may comprise an organoamine, particularly an organoamine having from about 6 to about 18 carbon atoms.

The depositing step may be performed by a deposition method selected from the group consisting of screen/stencil printing, stamping, microcontact printing, inkjet printing, spin coating, dip coating, blade coating, casting, and dipping.

The process may further comprise the step of depositing a semiconductor layer above the electrically conductive layer comprising silver. The semiconductor layer may be deposited prior to depositing the composition.

The electrically conductive layer may have a conductivity of at least 1,000 S/cm, at least 10,000 S/cm, or 20,000 S/cm.

In yet other embodiments, a process for making an electronic device is disclosed which comprises:

providing a first solution comprising silver-containing nanoparticles and an initial stabilizer on the surface of the silver-containing nanoparticles;

mixing the first solution with a carboxylic acid so as to replace at least a portion of the initial stabilizer with the carboxylic acid, resulting in a composition comprising the silver-containing nanoparticles and the carboxylic acid on the surface of the silver-containing nanoparticles;

depositing the composition upon a substrate, resulting in a deposited composition; and heating the deposited composition to form an electrically conductive layer comprising silver.

The molar ratio of carboxylic acid to silver in the solution may be from about 0.01 to about 1, or from about 0.02 to about 1, or from about 0.05 to about 0.5.

The heating may be performed at a temperature of from about 100° C. to about 200° C.

In other embodiments, a thin-film transistor is disclosed which comprises an electrically conductive layer, wherein the electrically conductive layer comprises silver-containing nanoparticles, the nanoparticles having a carboxylic acid on their surface.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1:
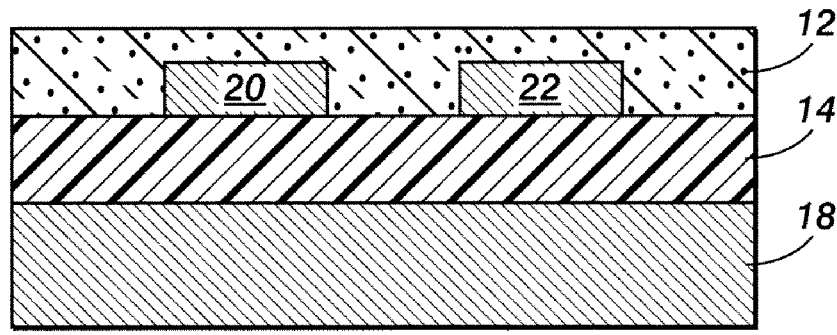
FIG. 1 represents a first embodiment of a thin film transistor fabricated according to the present disclosure.

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The term "nano" as used in "silver-containing nanoparticles" indicates a particle size of less than about 1000 nm. In embodiments, the silver-containing nanoparticles have a particle size of from about 1 nm to about 1000 nm, from about 1 nm to about 500 nm, from about 1 nm to about 100 nm, and particularly from about 1 nm to about 20 nm. Unless otherwise indicated, the particle sizes described herein are for silver-containing nanoparticles having the initial stabilizer on the surface thereof and for silver-containing nanoparticles having the replacement stabilizer on the surface thereof. In the present process, the particle size of the silver-containing nanoparticles may or may not change after mixing the replacement stabilizer. The particle size is defined herein as the average diameter of the silver-containing particles, excluding the initial stabilizer and replacement stabilizer, as determined by TEM (transmission electron microscopy).

Silver-containing nanoparticles may be prepared by any suitable method such as chemical methods and physical methods. For example, silver colloidal nanoparticles of about 5-7 nm in size may be made by physical methods such as that disclosed in C. Hayashi, "Ultrafine Particles", *J. Vacuum Sci. Technol. A, Vol.* 5, No. 4, pp. 1375-1384 (July/August 1987), the disclosure of which is totally incorporated herein by reference.

Chemical methods of making a composition comprising silver-containing nanoparticles in embodiments can involve mixing a silver compound with an initial stabilizer in an aqueous or non-aqueous medium with vigorous agitation, followed by the addition of a reducing agent. Any suitable chemical methods may be used for making a composition comprising silver-containing nanoparticles with molecules of an initial stabilizer on the surface of the silver-containing nanoparticles such as the representative methods disclosed in the following documents (the disclosures of which are totally incorporated herein by reference):

Yiliang Wu et al., U.S. application Ser. No. 11/187,552, filed Jul. 22, 2005, titled "METHODS TO MINIMIZE CONTACT RESISTANCE."

Y. Wu, Y. Li, and B. S. Ong, "Printed Silver Ohmic Contacts for High-Mobility Organic Thin-Film Transistors", *J. Am. Chem. Soc.*, vol. 128, 4202-4203 (2006).

X. Z. Lin, X. Teng, H. Yang, "Direct Synthesis of Narrowly Dispersed Silver Nanoparticles Using a Single-Source Precursor", *Langmuir*, vol. 19, 10081-10085 (2003), wherein X. Z. Lin et al reported synthesis of oleic acid-stabilized silver nanoparticles by heating silver trifluoroacetate in the presence of oleic acid in isoamylamine at 160 degrees C.

Y. Wu, Y. Li, and B. S. Ong, "Printed Silver Ohmic Contacts for High-Mobility Organic Thin-Film Transistors", *J. Am. Chem. Soc.*, vol. 128, 4202-4203, (2006), wherein Y. Wu et al described a method of preparing silver nanoparticles stabilized with oleic acid by reducing silver acetate using phenylhydrazine in the presence of oleic acid in toluene at a lower temperature (60 degrees C.).

In embodiments, the silver-containing nanoparticles are composed of elemental silver or a silver composite. Besides silver, the silver composite may include either or both of (i) one or more other metals and (ii) one or more non-metals. Suitable other metals include, for example, Al, Au, Pt, Pd, Cu, Co, Cr, In, and Ni, particularly the transition metals, for example, Au, Pt, Pd, Cu, Cr, Ni, and mixtures thereof. Exemplary metal composites are Au—Ag, Ag—Cu, Au—Ag—Cu, and Au—Ag—Pd. Suitable non-metals in the metal composite include, for example, Si, C, and Ge. The various components of the silver composite may be present in an amount ranging for example from about 0.01% to about 99.9% by weight, particularly from about 10% to about 90% by weight. In embodiments, the silver composite is a metal alloy composed of silver and one, two or more other metals, with silver comprising, for example, at least about 20% of the nanoparticles by weight, particularly greater than about 50% of the nanoparticles by weight. Unless otherwise noted, the weight percentages recited herein for the components of the silver-containing nanoparticles do not include the stabilizer, that is, initial stabilizer and/or replacement stabilizer.

Any suitable procedures can be used for fabricating silver composite nanoparticles such as the procedures described in S. Link, Z. L Wang, and M. A. El-Sayed, "Alloy Formation of Gold-Silver Nanoparticles and the Dependence of the Plasmon Absorption on Their Composition", J. Phys. Chem. vol. 103, 3529-3533 (1999), the disclosure of which is totally incorporated herein by reference, wherein S. Link et al. describes a method of preparing silver-gold alloy nanoparticles with an average diameter of 17-18 nm by refluxing chlorauric acid (HAuCl4) and silver nitrate ($AgNO_3$) in aqueous sodium citrate solution.

The initial stabilizer on the surface of the silver-containing nanoparticles can be any suitable compound such as a compound comprising a moiety selected from the group consisting of —$NH_2$ such as butylamine, pentylamine, hexylamine, heptylamine, octylamine, nonylamine, decylamine, undecylamine, dodecylamine, tridecylamine, tetradecylamine, pentadecylamine, hexadecylamine, oleylamine, octadecylamine, diaminopentane, diaminohexane, diaminoheptane, diaminooctane, diaminononane, diaminodecane, diaminooctane, —NH— such as dipropylamine, dibutylamine, dipentylamine, dihexylamine, diheptylamine, dioctylamine, dinonylamine, didecylamine, methylpropylamine, ethylpropylamine, propylbutylamine, ethylbutylamine, ethylpentylamine, propylpentylamine, butylpentylamine, polyethyleneimine, an ammonium salt such as tributylammonium bromide, didodecyldimethylammonium bromide, benzyltriethylammonium chloride, —SH such as butanethiol, pentanethiol, hexanethiol, heptanethiol, octanethiol, nonanethiol, decanethiol, undecanethiol, dodecanethiol, —OC(=S)SH (xanthic acid), such as O-methylxanthate, O-ethylxanthate, O-propylxanthic acid, O-butylxanthic acid, O-pentylxanthic acid, O-hexylxanthic acid, O-heptylxanthic acid, O-octylxanthic acid, O-nonylxanthic acid, O-decylxanthic acid, O-undecylxanthic acid, O-dodecylxanthic acid, —SO$_2$M (M is Li, Na, K, or Cs) such as sodium octylsulfate, sodium dodecylsulfate, —OH (alcohol) such as terpinol, starch, glucose, poly(vinyl alcohol), —C$_5$H$_4$N (pyridyl) such as poly(vinylpyridine), poly(vinylpyridine-co-styrene), poly(vinylpyridine-co-butyl methacrylate), —COOH such as butyric acid, pentanoic acid, hexanoic acid, heptanoic acid, octanoic acid, nonanoic acid, decanoic acid, undecanoic acid, dodecanoic acid, tridecanoic acid, myristic acid, pentadecanoic acid, palmitic acid, heptadecanoic acid, stearic acid, oleic acid, nonadecanoic acid, icosanoic acid, eicosenoic acid, elaidic acid, linoleic acid, pamitoleic acid, poly(acrylic acid), —COOM (M is Li, Na, or K) such as sodium oleate, elaidate, linoleate, palmitoleate, eicosenoate, stearate, polyacrylic acid, sodium salt), R'R'' P— and R'R'' P(=O)— (R', R'', and R''' are independently an alkyl having for instance 1 to 15 carbon atoms or aryl having for instance 6 to 20 carbon atoms) such as trioctylphosphine and trioctylphosphine oxide, and the like, or a mixture thereof.

The carboxylic acid as the replacement stabilizer is different from the initial stabilizer and can be any suitable carboxylic acid such as, for example, butyric acid, pentanoic acid, hexanoic acid, heptanoic acid, octanoic acid, nonanoic acid, decanoic acid, undecanoic acid, dodecanoic acid, tridecanoic acid, myristic acid, pentadecanoic acid, palmitic acid, pamitoleic acid, heptadecanoic acid, stearic acid, oleic acid, elaidic acid, linoleic acid, nonadecanoic acid, icosanoic acid, eicosenoic acid, and the like, or a mixture thereof.

The amount of the carboxylic acid as the replacement stabilizer used in the present process can be for example from about 0.01 to about 100 molar equivalents per mole of silver, or from about 0.1 to about 10 molar equivalents per mole of silver, or particularly from about 0.2 to about 5 molar equivalents per mole of silver. The amount of the carboxylic acid present on the surface of the silver-containing nanoparticles ranges, for example, from about 1% to about 90% by weight, particularly from about 5% to about 80% by weight, based on the weight of the silver-containing nanoparticles, the carboxylic acid on the surface thereof, and any residual amount of the initial stabilizer on the surface thereof.

It is understood that the terms "initial stabilizer," "replacement stabilizer," and any substances discussed herein for the "initial stabilizer" and "replacement stabilizer" are starting ingredients which may or may not be chemically transformed in the present process. For example, the resulting silver-containing nanoparticles with carboxylic acid may contain a residual amount of the initial stabilizer on the surface of the silver-containing nanoparticles, as a free form of the initial stabilizer, or as a complex or a compound that is formed with the carboxylic acid.

Any suitable liquid(s) may be used in the present process (to help disperse or dissolve) to facilitate for instance those aspects of the present process for: (a) providing a composition comprising silver-containing nanoparticles and molecules of an initial stabilizer on the surface of the silver-containing nanoparticles; and (b) mixing a carboxylic acid with the composition to replace at least a portion of the initial stabilizer with the carboxylic acid, resulting in molecules of the carboxylic acid on the surface of the silver-containing nanoparticles. Suitable liquids include for instance organic solvents and/or water. The organic solvents include for example hydrocarbon solvents such as pentane, hexane, cyclohexane, heptane, octane, nonane, decane, undecane, dodecane, tridecane, tetradecane, toluene, xylene, mesitylene, and the like, alcohols such as methanol, ethanol, propanol, butanol and the like, tetrahydrofuran, chlorobenzene, dichlorobenzene, trichlorobenzene, nitrobenzene, cyanobenzene, acetonitrile, and mixtures thereof. The amount of liquid used may be for example from about 5% to about 98% by weight, particularly from about 10% to about 95% by weight of the composition in (a) and/or the reaction mixture in (b).

The mixing of a carboxylic acid with a composition comprising silver-containing nanoparticles with an initial stabilizer on the surface of the silver-containing nanoparticles to replace at least a portion of the initial stabilizer with the carboxylic acid, resulting in molecules of the carboxylic acid on the surface of the silver-containing nanoparticles, is carried out at a suitable temperature of for example from about −50° C. to about 200° C., particularly from about 20° C. to about 100° C.

In embodiments, further processing of the composition comprising the silver-containing nanoparticles (with the carboxylic acid on the surface thereof) may occur such as, for example, making the composition compatible with a liquid deposition technique (e.g., for fabricating an electronic device). Such further processing of the composition comprising the silver-containing nanoparticles (with the carboxylic acid on the surface thereof) may be for instance: (i) removing all or a portion of solvent; or (ii) dissolving or dispersing the silver-containing nanoparticles composition with the carboxylic acid on the surface of the silver-containing nanoparticles in appropriate liquids.

In embodiments, the resulting silver-containing nanoparticles with carboxylic acid may contain a residual amount of the initial stabilizer on the surface of the silver-containing nanoparticles, as a free form of the initial stabilizer, or as a complex or a compound that is formed with the carboxylic acid. If present, the residual amount of the initial stabilizer on the surface of the silver-containing nanoparticles ranges from about 0.001% to about 95% by weight, particularly from about 0.01% to about 50% by weight, based on the weight of the residual initial stabilizer and the carboxylic acid on the surface of the nanoparticles.

The silver-containing nanoparticles having the carboxylic acid on the surface thereof are present in an amount ranging for example from about 5% to about 90% by weight, or from about 10% to about 50% by weight of composition (e.g., weight of liquid, silver-containing nanoparticles, replacement stabilizer, any residual initial stabilizer, etc.).

The fabrication of conductive elements from the present silver-containing nanoparticle compositions (in embodiments these compositions can be referred to as "inks"), which includes molecules of the carboxylic acid on the nanoparticle surface, can be carried out in embodiments using any suitable liquid deposition technique including i) printing such as screen/stencil printing, stamping, microcontact printing, ink jet printing and the like, and ii) coating such as spin-coating, dip coating, blade coating, casting, dipping, and the like. The deposited silver-containing nanoparticle features at this stage may or may not exhibit electrical conductivity.

In specific embodiments, a first solution and a carboxylic acid are mixed together. The first solution comprises the silver-containing nanoparticles having an initial stabilizer on their surface. The first solution and carboxylic acid are mixed so as to replace at least a portion of the initial stabilizer with the carboxylic acid, resulting in a composition comprising the silver-containing nanoparticles and the carboxylic acid on the surface of the silver-containing nanoparticles.

The molar ratio of carboxylic acid to silver in the first solution is from about 1% to about 100%. In more specific embodiments, the molar ratio is from about 2% to about 50%, from about 5% to about 30%, or from about 10% to about 20%.

In specific embodiments, the initial stabilizer comprises an organoamine, particularly an organoamine having from about 6 to about 18 carbon atoms. In other embodiments, the organoamine has from about 8 to about 18 carbon atoms. In other specific embodiments, the composition further comprises the initial stabilizer on the surface of the silver-containing nanoparticles.

In embodiments, the carboxylic acid used to replace the initial stabilizer has at least 4 carbon atoms. In specific embodiments, the carboxylic acid has at least 12 carbon atoms. Nanoparticles having carboxylic acids with less than 12 carbon atoms are less soluble than those with 12 or more carbon atoms.

The first solution and carboxylic acid can be stirred together for a period of from about one minute to about 120 minutes and occur at a temperature of from about 10° C. to about 80° C., particularly about room temperature (25° C.).

Heating the deposited composition or features at a temperature of below about 300° C., preferably at or below about 250° C. causes silver-containing nanoparticles to coalesce to form electrically conductive layers which are suitable for use as conductive elements in electronic devices. The heating is performed for a time ranging from for example about one minute to about 10 hours, particularly from about 5 minutes to about 1 hour. The heating can be done at a temperature of from about 100° C. to about 300° C. In more specific embodiments, the heating is performed at a temperature of from about 150° C. to about 200° C. or from about 170° C. to about 190° C.

The conductivity of the resulting silver-containing elements produced by heating the deposited silver-containing nanoparticle composition is, for example, at least one thousand S/cm. In other embodiments, the conductivity is at least ten thousand S/cm as measured by four-probe method.

The resulting conductive elements can be used as conductive electrodes, conductive pads, conductive lines, conductive tracks, and the like in electronic devices such as thin film transistor, organic light emitting diodes, RFID (radio frequency identification) tags, photovoltaic, and other electronic devices which require conductive elements or components.

In specific embodiments, the deposited composition is heated at a temperature of from about 120° C. to about 200° C., particularly about 180° C.

In FIG. 1, there is schematically illustrated a thin film transistor ("TFT") configuration 10 comprised of a heavily n-doped silicon wafer 18 which acts as both a substrate and a gate electrode, a thermally grown silicon oxide insulating layer 14 on top of which are deposited two metal contacts, source electrode 20 and drain electrode 22. Over and between the metal contacts 20 and 22 is a semiconductor layer 12 as illustrated herein.

Figure 2:
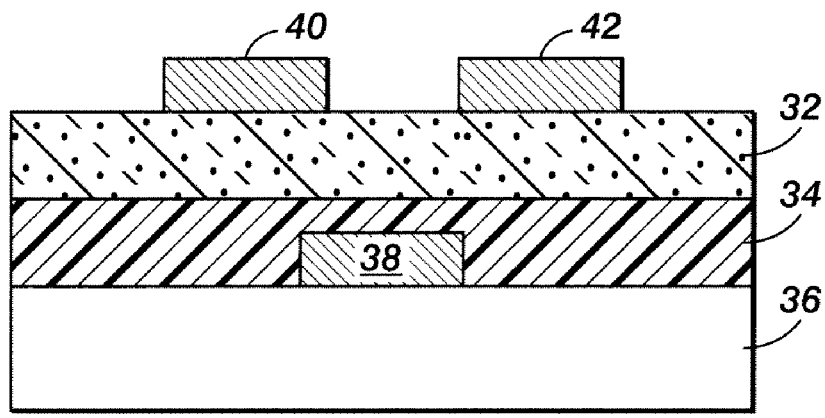
FIG. 2 represents a second embodiment of a thin film transistor fabricated according to the present disclosure.

FIG. 2 schematically illustrates another TFT configuration 30 comprised of a substrate 36, a gate electrode 38, a source electrode 40 and a drain electrode 42, an insulating layer 34, and a semiconductor layer 32.

Figure 3:
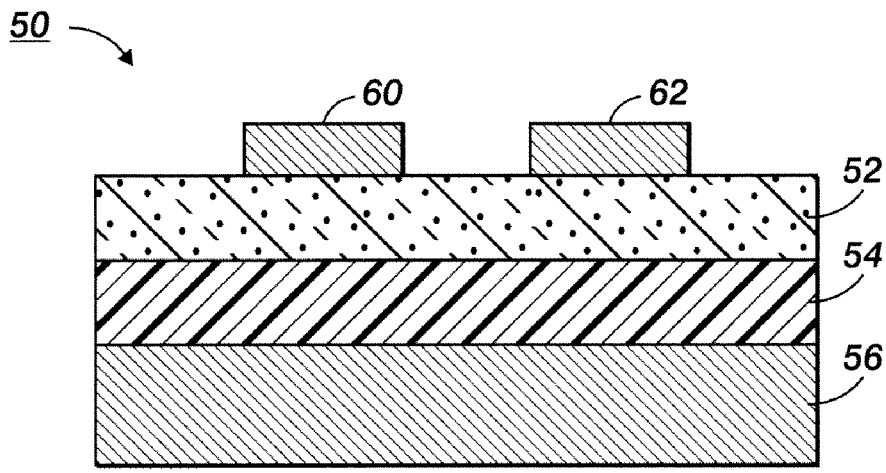
FIG. 3 represents a third embodiment of a thin film transistor fabricated according to the present disclosure.

FIG. 3 schematically illustrates a further TFT configuration 50 comprised of a heavily n-doped silicon wafer 56 which acts as both a substrate and a gate electrode, a thermally grown silicon oxide insulating layer 54, and a semiconductor layer 52, on top of which are deposited a source electrode 60 and a drain electrode 62.

Figure 4:
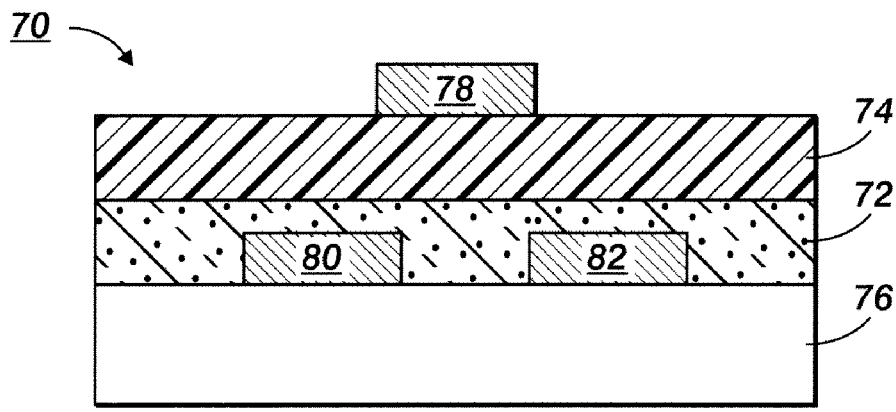
FIG. 4 represents a fourth embodiment of a thin film transistor fabricated according to the present disclosure.

FIG. 4 schematically illustrates an additional TFT configuration 70 comprised of substrate 76, a gate electrode 78, a source electrode 80, a drain electrode 82, a semiconductor layer 72, and an insulating layer 74.

The substrate may be composed of for instance silicon, glass plate, plastic film or sheet. For structurally flexible devices, plastic substrate, such as for example polyester, polycarbonate, polyimide sheets and the like may be used. The thickness of the substrate may be from amount 10 micrometers to over 10 millimeters with an exemplary thickness being from about 50 micrometers to about 2 millimeters, especially for a flexible plastic substrate and from about 0.4 to about 10 millimeters for a rigid substrate such as glass or silicon.

The gate electrode, the source electrode, and the drain electrode are fabricated by embodiments of the present disclosure. The thickness of the gate electrode layer ranges for example from about 10 to about 2000 nm. Typical thicknesses of source and drain electrodes are, for example, from about 40 nm to about 1 micrometer with the more specific thickness being about 60 to about 400 nm.

The insulating layer generally can be an inorganic material film or an organic polymer film. Illustrative examples of inorganic materials suitable as the insulating layer include silicon oxide, silicon nitride, aluminum oxide, barium titanate, barium zirconium titanate and the like; illustrative examples of organic polymers for the insulating layer include polyesters, polycarbonates, poly(vinyl phenol), polyimides, polystyrene, poly(methacrylate)s, poly(acrylate)s, epoxy resin and the like. The thickness of the insulating layer is, for example from about 10 nm to about 500 nm depending on the dielectric constant of the dielectric material used. An exemplary thickness of the insulating layer is from about 100 nm to about 500 nm. The insulating layer may have a conductivity that is for example less than about $10^{-12}$ S/cm.

Situated, for example, between and in contact with the insulating layer and the source/drain electrodes is the semiconductor layer wherein the thickness of the semiconductor layer is generally, for example, about 10 nm to about 1 micrometer, or about 40 to about 100 nm. Any semiconductor material may be used to form this layer. Exemplary semiconductor materials include regioregular polythiophene, oligthiophene, pentacene, and the semiconductor polymers disclosed in U.S. Pat. Nos. 6,621,099; 6,770,904; and 6,949,762; and "Organic Thin Film Transistors for Large Area Electronics" by C. D. Dimitrakopoulos and P. R. L. Malenfant, *Adv. Mater.*, Vol. 12, No. 2, pp. 99-117 (2002), the disclosures of which are totally incorporated herein by reference. Any suitable technique may be used to form the semiconductor layer. One such method is to apply a vacuum of about $10^{-5}$ to $10^{-7}$ torr to a chamber containing a substrate and a source vessel that holds the compound in powdered form. Heat the vessel until the compound sublimes onto the substrate. The semiconductor layer can also generally be fabricated by solution processes such as spin coating, casting, screen printing, stamping, or jet printing of a solution or dispersion of the semiconductor.

The insulating layer, the gate electrode, the semiconductor layer, the source electrode, and the drain electrode are formed in any sequence, particularly where in embodiments the gate electrode and the semiconductor layer both contact the insulating layer, and the source electrode and the drain electrode both contact the semiconductor layer. The phrase "in any sequence" includes sequential and simultaneous formation.

For example, the source electrode and the drain electrode can be formed simultaneously or sequentially. The composition, fabrication, and operation of thin film transistors are described in Bao et al., U.S. Pat. No. 6,107,117, the disclosure of which is totally incorporated herein by reference.

The following examples are for purposes of further illustrating the present disclosure. The examples are merely illustrative and are not intended to limit devices made in accordance with the disclosure to the materials, conditions, or process parameters set forth therein. All parts are percentages by volume unless otherwise indicated.

EXAMPLES

Example 1

Two exemplary types of silver-containing nanoparticles were prepared.

1A) Synthesis of Hexadecylamine-Stabilized Silver Nanoparticles

Silver acetate (1.67 g, 10 mmol) and 1-hexadecylamine (6.1 g, 25 mmol) were first dissolved in toluene (20 mL) by heating at 60° C. until silver acetate was dissolved (about 5 minutes). To this solution was added a solution of phenylhydrazine (0.59 g, 5.5 mmol) in toluene (10 mL) with stirring over a period of 5 minutes. The resulting reaction mixture was stirred at 60° C. for another 30 min before cooling down to room temperature. The mixture was added to a stirring methanol/acetone mixture (100 mL/100 mL) to precipitate the silver nanoparticle product, which was filtered, washed with a mixture of methanol/acetone (1:1, w/w) (3×50 mL), and then air-dried, providing hexadecylamine-stabilized silver nanoparticle product as a grey solid which was used directly in Example 2. Yield: 1.20 g (~99% yield based on silver content of 90 wt % as determined by TGA).

1B) Synthesis of Oleylamine-Stabilized Silver Nanoparticles

Silver acetate (1.67 g, 10 mmol) and oleylamine (6.69 g, 25 mmol) were first dissolved in toluene (20 mL) by heating at 60° C. until silver acetate was dissolved (about 5 minutes). To this solution was added a solution of phenylhydrazine (0.59 g, 5.5 mmol) in toluene (10 mL) with stirring over a period of 5 minutes. The resulting reaction mixture was stirred at 60° C. for another 30 min before cooling down to room temperature. The mixture was added to a stirring methanol/acetone mixture (100 mL/100 mL) to precipitate the silver nanoparticle product, which was filtered, washed with a mixture of methanol/acetone (1:1, w/w) (3×50 mL), and then air-dried, providing oleylamine-stabilized silver nanoparticle product as a grey solid which was used directly in Example 2. Yield: 1.29 g (~100% yield based on silver content of 72 wt % as determined by TGA).

Example 2

Two exemplary types of silver-containing nanoparticle compositions were prepared.

2A)
To a solution of hexadecylamine-stabilized silver nanoparticles (0.61 g, 5 mmol of Ag) in toluene (20 mL) was added a solution of undecylenic acid (0.184 g, 1 mmol) in 5 mL of toluene (i.e. ratio of acid:silver=0.2). The solution was stirred for 15 minutes at room temperature, and then the solvent was removed in vacuo (at 40° C.) to obtain a concentrated solution (4.0 g, 12.5 mmol Ag/g), which was filtered using a 0.2 micron PTEFT or glass filter.

2B)
To a solution of hexadecylamine-stabilized silver nanoparticles (0.61 g, 5 mmol of Ag) in toluene (20 mL) was added a solution of 1-decanoic acid (0.17 g, 1 mmol) in 5 mL of toluene (i.e. ratio of acid:silver=0.2). The solution was stirred for 15 minutes at room temperature, and then the solvent was removed in vacuo (at 40° C.) to obtain a concentrated solution (4.0 g, 12.5 mmol Ag/g), which was filtered using a 0.2 micron PTEFT or glass filter.

2C)
To a solution of hexadecylamine-stabilized silver nanoparticles (0.61 g, 5 mmol of Ag) in toluene (20 mL) was added a solution of 1-dodecanoic acid (0.20 g, 1 mmol) in 5 mL of toluene (i.e. ratio of acid:silver=0.2). The solution was stirred for 15 minutes at room temperature, and then the solvent was removed in vacuo (at 40° C.) to obtain a concentrated solution (4.0 g, 12.5 mmol Ag/g), which was filtered using a 0.2 micron PTEFT or glass filter.

2D)
To a solution of oleylamine-stabilized silver nanoparticles (0.61 g, 5 mmol of Ag) in toluene (20 mL) was added a solution of 1-dodecanoic acid (0.20 g, 1 mmol) in 5 mL of toluene (i.e. ratio of acid:silver=0.2). The solution was stirred for 15 minutes at room temperature, and then the solvent was removed in vacuo (at 40° C.) to obtain a concentrated solution (4.0 g, 12.5 mmol Ag/g), which was filtered using a 0.2 micron PTEFT or glass filter.

Example 3

The four compositions of Example 2 were used to form a thin film of carboxylic acid-stabilized silver nanoparticles.

A solution from Example 2 was spin-coated on a glass substrate at a speed of 1000 rpm for 120 seconds. The substrate with a shiny layer of dark brown silver nanoparticles was heated on a hotplate at 180° C. for 45 minutes in air. A shiny silver thin film was then obtained. The thickness of silver thin film s is about 100 nm. The conductivity of the thin films was measured using a conventional four-probe technique. The conductivity of the thin films made from carboxylic acid-stabilized silver nanoparticles was $1.7 \times 10^4$ to $3.6 \times 10^4$ S/cm, which is in the same order of magnitude as the conductivity of a vacuum-deposited silver thin film (the control). See Table 1.

TABLE 1

| Silver Nanoparticle Composition | Solubility | Conductivity (S/cm) |
|---|---|---|
| 2A | Very good | 36,000 |
| 2B | Very good | 17,000 |
| 2C | Very good | 23,000 |
| 2D | Very good | 30,000 |
| Vacuum deposited Ag | N/A | 39,000 |

The compositions of Example 2 were also more stable than the nanoparticles of Example 1 alone. No precipitation was observed after 3 weeks for solutions of the silver nanoparticle compositions of Example 2, whereas solutions of the amine-stabilized nanoparticles of Example 1 showed precipitation after about 5 days.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. A silver nanoparticle composition formed by the process comprising:
providing a solution of silver-containing nanoparticles with an initial stabilizer on the surface of the silver-containing nanoparticles; and
mixing the solution with a carboxylic acid so as to replace at least a portion of the initial stabilizer with the carboxylic acid, resulting in a composition comprising silver-containing nanoparticles having both the initial stabilizer and the carboxylic acid on the surface of the silver-containing nanoparticles, the carboxylic acid having at least 12 carbon atoms.

2. The composition of claim 1, wherein the molar ratio of carboxylic acid to silver in the solution is from about 0.01 to about 1.

3. The composition of claim 1, wherein the molar ratio of carboxylic acid to silver in the solution is from about 0.05 to about 0.5.

4. The composition of claim 1, wherein the initial stabilizer comprises an organoamine.

5. The composition of claim 1, wherein the initial stabilizer comprises an organoamine having from about 6 to about 18 carbon atoms.

6. The composition of claim 1, wherein the silver-containing nanoparticles have an average diameter of from about 1 nanometer to about 1000 nanometers.

7. A process for making an electronic device, comprising:
depositing a composition upon a substrate, the composition comprising silver-containing nanoparticles with a carboxylic acid stabilizer and an organoamine stabilizer on the surface of the silver-containing nanoparticles, the carboxylic acid stabilizer having at least 12 carbon atoms, resulting in a deposited composition; and
heating the deposited composition to form an electrically conductive layer comprising silver.

8. The process of claim 7, wherein the heating is performed at a temperature of from about 100° C. to about 300° C.

9. The process of claim 7, wherein the heating is performed at a temperature of from about 150° C. to about 200° C.

10. The process of claim 7, wherein the organoamine stabilizer has from about 6 to about 18 carbon atoms.

11. The process of claim 7, wherein the depositing step is performed by a deposition method selected from the group consisting of screen/stencil printing, stamping, microcontact printing, inkjet printing, spin coating, dip coating, blade coating, casting, and dipping.

12. The process of claim 7, further comprising the step of depositing a semiconductor layer above the electrically conductive layer comprising silver.

13. The process of claim 7, further comprising the step of depositing a semiconductor layer prior to depositing the composition comprising silver-containing nanoparticles.

14. The process of claim 7, wherein the electrically conductive layer has a conductivity of at least 1,000 S/cm.

15. The process of claim 7, wherein the electrically conductive layer has a conductivity of at least 10,000 S/cm.

16. A process for making an electronic device, comprising:
providing a solution comprising silver-containing nanoparticles and an initial stabilizer on the surface of the silver-containing nanoparticles;
mixing the solution with a carboxylic acid, the carboxylic acid having at least 12 carbon atoms, so as to replace at least a portion of the initial stabilizer with the carboxylic acid, the mixing being performed at about 25° C., resulting in a composition comprising silver-containing nanoparticles having both the initial stabilizer and the carboxylic acid on the surface of the silver-containing nanoparticles;
depositing the composition upon a substrate, resulting in a deposited composition; and
heating the deposited composition to form an electrically conductive layer comprising silver.

17. The composition of claim 16, wherein the molar ratio of carboxylic acid to silver in the solution is from about 0.01 to about 1.

18. The process of claim 16, wherein the molar ratio of carboxylic acid to silver in the solution is from about 0.05 to about 0.5.

19. The process of claim 16, wherein the heating is performed at a temperature of from about 100° C. to about 200° C.

20. A thin-film transistor comprising an electrically conductive layer, wherein the electrically conductive layer comprises silver-containing nanoparticles, the nanoparticles having a carboxylic acid stabilizer and an amine stabilizer on their surface, the carboxylic acid stabilizer having at least 12 carbon atoms.

* * * * *